United States Patent
Shaw

(10) Patent No.: US 10,256,690 B2
(45) Date of Patent: Apr. 9, 2019

(54) STRUCTURES AND METHODS FOR CONTROLLING LOSSES IN PRINTED CIRCUIT BOARDS

(71) Applicant: E-Circuit Motors, Inc., Newton, MA (US)

(72) Inventor: Steven Robert Shaw, Bozeman, MT (US)

(73) Assignee: E-Circuit Motors, Inc., Newton, MA (US)

( * ) Notice: Subject to any disclaimer, the term of this patent is extended or adjusted under 35 U.S.C. 154(b) by 0 days.

(21) Appl. No.: 16/165,745

(22) Filed: Oct. 19, 2018

(65) Prior Publication Data

US 2019/0058368 A1 Feb. 21, 2019

Related U.S. Application Data

(63) Continuation of application No. 15/852,972, filed on Dec. 22, 2017, now Pat. No. 10,170,953, which is a (Continued)

(51) Int. Cl.
*H02K 3/26* (2006.01)
*H02K 1/27* (2006.01)
(Continued)

(52) U.S. Cl.
CPC ............ *H02K 3/26* (2013.01); *H02K 1/182* (2013.01); *H02K 1/27* (2013.01); *H02K 3/50* (2013.01); *H02K 21/24* (2013.01); *H05K 1/0298* (2013.01)

(58) Field of Classification Search
CPC .......... H02K 3/26; H02K 21/24; H02K 1/182; H02K 1/27; H02K 3/50; H05K 1/0298
See application file for complete search history.

(56) References Cited

U.S. PATENT DOCUMENTS

| 2,970,238 A | 1/1961 | Swiggett |
| 3,096,455 A | 7/1963 | Hahn |
(Continued)

FOREIGN PATENT DOCUMENTS

| CN | 103001426 A | 3/2013 |
| CN | 104426263 A | 3/2015 |
(Continued)

OTHER PUBLICATIONS

International Search Report and Written Opinion for Application No. PCT/US2016/054794, dated Jan. 4, 2017.
(Continued)

*Primary Examiner* — Naishadh N Desai
(74) *Attorney, Agent, or Firm* — Pierce Atwood LLP

(57) ABSTRACT

The disclosure relates to printed circuit board motors and specifically to printed circuit boards used in motors and generators. Windings formed from copper on printed circuit boards have been used for purposes of forming antennas, inductors, transformers, and stators that can be incorporated in permanent magnet brushless DC (permanent magnet synchronous) machines. For energy conversion devices using modern permanent magnet materials and PCB stators, the magnetic field is not strongly confined by magnetically susceptible materials. Thus, the interaction between fields from adjacent turns in a winding, and/or windings on adjacent layers (for a multilayer configuration) may be significant. The structures disclosed hereinafter reduce the effective resistance in the windings, and therefore reduce the associated losses to achieve a reduced current density in portions of the rotating energy conversion devices. The effect of the disclosed structures is a measurable reduction in loss mechanisms as a function increasing frequency, compared to the currently available devices. These effects are significant in frequency ranges important to energy conver- (Continued)

sion processes as well as typical control strategies, for example, pulse-width modulation.

19 Claims, 21 Drawing Sheets

Related U.S. Application Data continuation-in-part of application No. 15/611,359, filed on Jun. 1, 2017, now Pat. No. 9,859,763, which is a continuation-in-part of application No. 15/283,088, filed on Sep. 30, 2016, now Pat. No. 9,800,109, which is a continuation-in-part of application No. 15/199,527, filed on Jun. 30, 2016, now Pat. No. 9,673,684, and application No. 15/611,359, which is a continuation-in-part of application No. 15/208,452, filed on Jul. 12, 2016, now Pat. No. 9,673,688.

(60) Provisional application No. 62/530,552, filed on Jul. 10, 2017, provisional application No. 62/236,407, filed on Oct. 2, 2015, provisional application No. 62/236,422, filed on Oct. 2, 2015, provisional application No. 62/275,653, filed on Jan. 6, 2016.

(51) Int. Cl.
| | |
|---|---|
| *H02K 1/18* | (2006.01) |
| *H02K 3/50* | (2006.01) |
| *H05K 1/02* | (2006.01) |
| *H02K 21/24* | (2006.01) |

(56) References Cited

U.S. PATENT DOCUMENTS

| | | | |
|---|---|---|---|
| 3,944,857 A | 3/1976 | Faulhaber et al. | |
| 4,115,915 A | 9/1978 | Godfrey | |
| 4,658,162 A | 4/1987 | Koyama et al. | |
| 4,677,332 A | 6/1987 | Heyraud | |
| 4,733,115 A * | 3/1988 | Barone | H02K 3/26 310/184 |
| 4,804,574 A | 2/1989 | Osawa et al. | |
| 5,099,162 A | 3/1992 | Sawada | |
| 5,126,613 A | 6/1992 | Choi | |
| 5,332,460 A | 7/1994 | Hosoya | |
| 5,592,037 A | 1/1997 | Sickafus | |
| 5,644,183 A | 7/1997 | Van Loenen et al. | |
| 5,710,476 A | 1/1998 | Ampela | |
| 5,952,742 A | 9/1999 | Stoiber et al. | |
| 6,628,038 B1 | 9/2003 | Shikayama et al. | |
| 7,109,625 B1 | 9/2006 | Jore et al. | |
| 7,112,910 B2 | 9/2006 | Lopatinsky et al. | |
| 7,301,428 B2 | 11/2007 | Suzuki et al. | |
| 7,415,756 B2 | 8/2008 | Ishida et al. | |
| 7,523,540 B2 | 4/2009 | Morel | |
| 7,750,522 B2 | 7/2010 | Gizaw et al. | |
| 7,812,697 B2 | 10/2010 | Fullerton et al. | |
| 7,882,613 B2 | 2/2011 | Barthelmie et al. | |
| 8,058,762 B2 | 11/2011 | Asano | |
| 8,225,497 B2 | 7/2012 | Johnson et al. | |
| 8,339,019 B1 | 12/2012 | Oyague | |
| 8,362,731 B2 | 1/2013 | Smith et al. | |
| 8,397,369 B2 | 3/2013 | Smith et al. | |
| 8,400,038 B2 | 3/2013 | Smith et al. | |
| 8,558,425 B2 | 10/2013 | Stahlhut et al. | |
| 8,598,761 B2 | 12/2013 | Langford et al. | |
| 8,692,637 B2 | 4/2014 | Richards et al. | |
| 8,716,913 B2 | 5/2014 | Kvam et al. | |
| 8,723,052 B1 | 5/2014 | Sullivan et al. | |
| 8,723,402 B2 | 5/2014 | Oyague | |
| 8,736,133 B1 | 5/2014 | Smith et al. | |
| 8,785,784 B1 * | 7/2014 | Duford | H02K 3/26 174/255 |
| 8,823,241 B2 | 9/2014 | Jore et al. | |
| 8,941,961 B2 | 1/2015 | Banerjee et al. | |
| 9,013,257 B2 | 4/2015 | Steingroever | |
| 9,154,024 B2 | 10/2015 | Jore et al. | |
| 9,269,483 B2 | 2/2016 | Smith et al. | |
| 9,479,038 B2 | 10/2016 | Smith et al. | |
| 9,673,684 B2 | 6/2017 | Shaw | |
| 2006/0055265 A1 | 3/2006 | Zalusky | |
| 2006/0202584 A1* | 9/2006 | Jore | H02K 21/24 310/179 |
| 2007/0247014 A1* | 10/2007 | Schach | H02K 23/02 310/184 |
| 2008/0067874 A1 | 3/2008 | Tseng | |
| 2008/0100166 A1 | 5/2008 | Stahlhut et al. | |
| 2009/0021333 A1 | 1/2009 | Fiedler | |
| 2009/0072651 A1 | 3/2009 | Yan et al. | |
| 2010/0000112 A1 | 1/2010 | Carow et al. | |
| 2010/0123372 A1 | 5/2010 | Huang et al. | |
| 2012/0033236 A1 | 2/2012 | Tsugimura | |
| 2012/0041062 A1 | 2/2012 | Zhou et al. | |
| 2012/0217831 A1 | 8/2012 | Jore et al. | |
| 2012/0262019 A1 | 10/2012 | Smith et al. | |
| 2012/0262020 A1 | 10/2012 | Smith et al. | |
| 2013/0049500 A1 | 2/2013 | Shan et al. | |
| 2013/0052491 A1 | 2/2013 | Bull et al. | |
| 2013/0053942 A1 | 2/2013 | Kamel et al. | |
| 2013/0072604 A1 | 3/2013 | Bowen, III et al. | |
| 2013/0076192 A1 | 3/2013 | Tanimoto | |
| 2013/0119802 A1 | 5/2013 | Smith et al. | |
| 2013/0214631 A1 | 8/2013 | Smith et al. | |
| 2013/0234566 A1 | 9/2013 | Huang et al. | |
| 2014/0021968 A1 | 1/2014 | Lee | |
| 2014/0021969 A1 | 1/2014 | Tseng et al. | |
| 2014/0021972 A1 | 1/2014 | Barabi et al. | |
| 2014/0028149 A1 | 1/2014 | Oyague | |
| 2014/0042868 A1 | 2/2014 | Sullivan et al. | |
| 2014/0152136 A1 | 6/2014 | Duford et al. | |
| 2014/0175922 A1 | 6/2014 | Jore et al. | |
| 2014/0201291 A1 | 7/2014 | Russell | |
| 2014/0262499 A1 | 9/2014 | Smith et al. | |
| 2014/0268460 A1 | 9/2014 | Banerjee et al. | |
| 2014/0368079 A1 | 12/2014 | Wong et al. | |
| 2015/0084446 A1 | 3/2015 | Atar | |
| 2015/0188375 A1 | 7/2015 | Sullivan et al. | |
| 2015/0188391 A1 | 7/2015 | Carron et al. | |
| 2015/0311756 A1 | 10/2015 | Sullivan | |
| 2015/0318751 A1 | 11/2015 | Smith et al. | |
| 2016/0247616 A1 | 8/2016 | Smith et al. | |
| 2016/0372995 A1 | 12/2016 | Smith et al. | |
| 2017/0040878 A1 | 2/2017 | Smith et al. | |
| 2017/0098973 A1 | 4/2017 | Shaw | |
| 2017/0098982 A1 | 4/2017 | Shaw | |

FOREIGN PATENT DOCUMENTS

| | | |
|---|---|---|
| CN | 105871089 A1 | 8/2016 |
| EP | 0563852 A1 | 10/1993 |
| EP | 2882079 A2 | 6/2015 |
| FR | 2262880 A1 | 9/1975 |
| GB | 2485185 A | 5/2012 |
| JP | 58036145 A | 3/1983 |
| JP | 59213287 A | 12/1984 |
| WO | 2004015843 A1 | 2/2004 |
| WO | 2004073365 A2 | 8/2004 |
| WO | 2009068079 A1 | 6/2009 |

OTHER PUBLICATIONS

International Search Report and Written Opinion for Application No. PCT/US2016/054704, dated Jan. 20, 2017.
International Search Report and Written Opinion for Application No. PCT/US20108/039500, dated Sep. 20, 2018.

* cited by examiner

STRUCTURES AND METHODS FOR CONTROLLING LOSSES IN PRINTED CIRCUIT BOARDS

CROSS-REFERENCE TO RELATED APPLICATIONS

This application is a continuation of and claims the benefit under 35 U.S.C. § 120 to U.S. patent application Ser. No. 15/852,972, entitled PLANAR COMPOSITE STRUCTURES AND ASSEMBLIES FOR AXIAL FLUX MOTORS AND GENERATORS, filed Dec. 22, 2017, and now U.S. Pat. No. 10,170,953, which claims the benefit under 35 U.S.C. § 119(e) of U.S. Provisional Application Ser. No. 62/530,552, entitled STRUCTURES AND METHODS OF STACKING SUBASSEMBLIES IN PLANAR COMPOSITE STATORS TO OBTAIN HIGHER WORKING VOLTAGES, filed Jul. 10, 2017, and which is also a continuation-in-part of and claims the benefit under 35 U.S.C. § 120 to U.S. patent application Ser. No. 15/611,359, entitled STRUCTURES AND METHODS FOR CONTROLLING LOSSES IN PRINTED CIRCUIT BOARDS, filed Jun. 1, 2017, and now U.S. Pat. No. 9,859,763, which (A) is a continuation-in-part of and claims the benefit under 35 U.S.C. § 120 to U.S. patent application Ser. No. 15/283,088, entitled STRUCTURES AND METHODS FOR CONTROLLING LOSSES IN PRINTED CIRCUIT BOARDS, filed Sep. 30, 2016, and now U.S. Pat. No. 9,800,109, which is a continuation-in-part and claims the benefit under 35 U.S.C. § 120 to U.S. patent application Ser. No. 15/199,527, entitled STRUCTURES AND METHODS FOR THERMAL MANAGEMENT IN PRINTED CIRCUIT BOARD STATORS, filed Jun. 30, 2016, and now U.S. Pat. No. 9,673,684, and which also claims the benefit under 35 U.S.C. § 119(e) to each of U.S. Provisional Patent Application Ser. No. 62/236,407, entitled STRUCTURES TO REDUCE LOSSES IN PRINTED CIRCUIT BOARD WINDINGS, filed Oct. 2, 2015, and U.S. Provisional Patent Application Ser. No. 62/236,422, entitled STRUCTURES FOR THERMAL MANAGEMENT IN PRINTED CIRCUIT BOARD STATORS, filed Oct. 2, 2015, and (B) is a continuation-in-part of and claims the benefit under 35 U.S.C. § 120 to U.S. patent application Ser. No. 15/208,452, entitled APPARATUS AND METHOD FOR FORMING A MAGNET ASSEMBLY, filed Jul. 12, 2016, and now U.S. Pat. No. 9,673,688, which claims the benefit under 35 U.S.C. § 119(e) to U.S. Provisional Patent Application Ser. No. 62/275,653, entitled ALIGNMENT OF MAGNETIC COMPONENTS IN AXIAL FLUX MACHINES WITH GENERALLY PLANAR WINDINGS, filed Jan. 6, 2016. The contents of each of the foregoing applications, publications, and patents are hereby incorporated herein, by reference, in their entireties, for all purposes.

FIELD

Embodiments described herein are generally related to the field of reducing losses in printed circuit board devices. More specifically, embodiments as disclosed herein are related to the field of winding loss management in stators made on multi-layer printed circuit boards for electric motors and/or generators.

BACKGROUND

The inventor has recognized and appreciated that current electric motors and other electric devices handling high currents through electrical leads in a printed circuit board (PCB) face multiple problems resulting from the electrical current flow in the PCB. Such problems include the generation of unwanted heat due to parasitic or eddy currents, which can lead to mechanical failure and destructive mechanical interferences with the rotor of the motor or generator, as well as other inefficiencies in the operation of the motor or generator. As a byproduct of the increased current density flow in regions of the electrical circuit, high temperature gradients in the PCB caused by, inter alia, high electrical current gradients may lead to structural damage of the PCB, such as delamination, or localized failure or degradation of the electrical leads or the dielectric material in the substrate. More importantly, perhaps, these high electric current densities act to generate undesirable larger electromagnetic fields which can create, for example, parasitic and eddy currents in physically nearby regions of the electric circuits, which in turn can act as a drag on the motor or generator rotor and thereby reduce its power output and efficiency.

Printed circuit board electric devices built without the advantageous features described hereinafter, employ a variety of strategies to make connections between electrical current carrying traces laid down on the PCB surface, or surfaces in the case of a multilayer board device, of the dielectric substrates found in these devices. These strategies, however, do not address, or recognize in any substantial way, the disadvantages resulting from enhanced current density in portions of the electric circuit traces and the adverse results therefrom.

SUMMARY

A particular example embodiment of the disclosure relates to printed circuit board motors and generators. Windings formed from copper in printed circuit boards have been used for purposes of forming antennas, inductors, transformers, and stators that can be incorporated in permanent magnet brushless DC (permanent magnet synchronous) machines. For energy conversion devices using modern permanent magnet materials and PCB stators, the magnetic field is not strongly confined by magnetically susceptible materials. Thus, the interaction between fields from adjacent turns in a winding, and/or windings on adjacent layers (for a multi-layer configuration) may be significant. The structures disclosed hereinafter reduce the effective resistance in the windings, and therefore reduce the associated losses to achieve a specified current density in rotating energy conversion devices. The effect of the disclosed structures is a measurable reduction in loss mechanisms as a function of increasing frequency, compared to the currently available devices. These effects are significant in frequency ranges important to energy conversion processes as well as typical control strategies, for example, pulse-width modulation.

In a first example embodiment, the disclosure relates to the structure of an electrical motor or generator stator which includes a planar composite structure (PCS) having at least one dielectric layer and a plurality of conductive layers. The PCS is characterized at least in part by a center origin point and a periphery. The stator can also include a plurality of first elements, radially extending conductive traces, which extend from an inner radial distance $r_s$ to an outer radial distance $r_1$, the radii being measured from the center origin point toward the periphery of the PCS. The traces are generally angularly disposed on the PCS. The plurality of first radially extending elements are each connected at their inner and outer ends to enable winding loops, and other circuit structures, to be formed. When the elements are connected in such loops, the outer ends of the elements are connected using outer loop interconnects and the inner ends of the elements are connected using inner loop interconnects as described in more detail hereinafter. Further, according to some example embodiments of the disclosure, at least one of the first radial conductive elements is connected to at least one other of the radial conductive elements at their respective outer radius ends. Also, first conductive elements are connected at their inner radius ends to other radially conductive elements. There can result plural closed loops having multiple windings and forming the stator, for example, of an electrical motor or generator.

A second example embodiment of the disclosure relates to an electrical motor or generator having a stator which includes a PCS with at least one dielectric layer and at least one conductive layer, the PCS being characterized at least in part by a center origin point and a periphery. The stator can also include a plurality of first electrically conductive traces extending radially from a starting radius, $r_0$, from the center origin point toward the periphery of the PCS and disposed angularly on the PCS. A plurality of the conductive traces connect through a respective associated interconnect to at least one other conductive trace extending radially from an inner radius $r_0$ from the center origin point radially outward toward the periphery of the PCS and disposed angularly from the associated conductive trace.

In another example embodiment, a stator has a planar composite structure (PCS) with at least one dielectric layer and a conductive pattern on a surface of each said dielectric layer. The conductive pattern has a plurality of first conductive traces, each extending radially from an inner radius to an outer radius and disposed angularly on one of the dielectric surfaces, with at least one of the first conductive traces connected at its outer radius to at least one other of the first conductive traces at its outer radius by a first interconnect. The first interconnect is bounded between inner and outer edges. The first interconnect has a starting region, a transition region, and an ending region, and the starting region has a first radiused inner edge section extending from the first conductive trace to the transition region, and the ending region has a second radiused inner edge section extending from the transition region to the other conductive trace; and wherein at least the first radiused inner edge section and the second radiused inner edge section is are each characterized at least in part by a Corner Equation, $$r(\theta) = r_d + (r_s - r_d)e^{-\frac{\theta-\theta_s}{\alpha}}$$

for a corner starting at $\theta_s$ and $r_s$ and evaluated for $\theta > \theta_s$, or the equivalent reflected version with $r(\theta)=r_d+(r_s-r_d)e^{-(\theta_s-\theta)/\alpha}$ for a corner evaluated with $\theta<\theta_s$ and ending at $\theta_s$ and $r_s$.

In yet another example embodiment, a stator has a planar composite structure (PCS) having at least one dielectric layer and a conductive pattern on a surface of each said dielectric layer. At least one conductive pattern has a plurality of first conductive traces, each extending radially from an inner radius to an outer radius and disposed angularly on one of the dielectric surfaces. At least one of the first conductive traces connected at its outer radius to at least one other of the first conductive elements at its outer radius by a first interconnect, and wherein at least the first interconnect is bounded by inner and outer edges, and has a starting region, a transition region, and an ending region, and the starting region has a first radiused inner edge section and a first radiused outer edge section extending from the first conductive trace to the transition region, and a second radiused inner edge section and a second radiused outer edge section extending from the transition region to the other conductive trace. At least the first radiused inner and outer edge sections and the second radiused inner and outer edge sections are each characterized at least in part by the Corner Equation $$r(\theta) = r_d + (r_s - r_d)e^{-\frac{\theta-\theta_s}{\alpha}}$$

for a corner starting at $\theta_s$ and $r_s$ and evaluated for $\theta>\theta_s$, or the equivalent reflected version with $r(\theta)=r_d+(r_s-r_d)e^{-(\theta_s-\theta)/\alpha}$ for a corner evaluated with $\theta<\theta_s$ and ending at $\theta_s$ and $r_s$.

In another example embodiment, a stator has a planar composite structure (PCS) with at least one dielectric layer and a conductive pattern on a surface of each said dielectric layer. At least one conductive pattern has a plurality of first conductive traces, each extending radially from an inner radius to an outer radius and disposed angularly on one of the dielectric surfaces. At least one of the first conductive traces is connected at its outer radius to at least one other of the first conductive elements at its outer radius by a first interconnect. The first interconnect is bounded by an inner edge and an outer edge. The first interconnect has a starting region, a transition region, and an ending region, and the inner edge of the starting region has a first radiused inner edge section extending from the first conductive trace at its outer radius to the transition region, and a second radiused inner edge section extending from the transition region to the other conductive trace at its outer radius. At least the first radiused inner edge section and the second radiused inner edge section are each characterized by a slope $dr/d\theta$ which is a linear function of $r(\theta)$ from the one conductive trace to the transitional region and where the slope is a different linear function from the transitional region to the other conductive trace.

In yet another example embodiment, a stator has a planar composite structure (PCS) comprising at least one dielectric layer and a conductive pattern on a surface of each said dielectric layer. At least one conductive pattern has a plurality of first conductive traces, each extending radially from an inner radius to an outer radius and disposed angularly on one of the dielectric surfaces. At least one of the first conductive traces is connected at its outer radius to a starting region of a first interconnect. The first interconnect is bounded by inner and outer edges, and the first interconnect having the starting region, a transition region, and an ending region, and a first radiused inner edge section extending from the outer radius of the one conductive trace to the transition region, and a second radiused inner edge section extending from the transition region to the other conductive trace at its outer radius. At any point between the inner and outer edge, the smallest current density magnitude under direct current excitation is not less than 50% of the largest current density magnitude evaluated along the shortest line between the inner and outer edge passing through that point.

In another example embodiment, a stator, has a planar composite structure (PCS) having at least two dielectric layers and a conductive pattern on a surface of each said dielectric layer. At least one conductive pattern has a plurality of first conductive traces, each extending radially from an inner radius to an outer radius and disposed angularly on different ones of the dielectric surfaces. At least one of the first conductive traces is connected at its outer radius to at least one other of the first conductive traces on a different surface at its outer radius by a first interlayer interconnect. The interconnect is substantially bounded by inner and outer edges. The first interlayer interconnect has a starting region on a first layer, a transition region, and an ending region on a different layer, and further has a first radiused inner edge section extending from a first conductive trace to the transition region, and a second radiused inner edge section extending from the transition region to the other conductive trace at its outer radius; and wherein at least the first radiused inner edge section and the second radiused inner edge section are each characterized at least in part by a structure designed to reduce parasitic and eddy current effects on axially adjacent conductive surface structures.

In a further example embodiment a stator has a planar composite structure (PCS) having at least one dielectric layer and a conductive pattern on a surface of each the dielectric layer. At least one conductive pattern has a plurality of first conductive traces, each extending radially from an inner radius to an outer radius and disposed angularly on one of the dielectric surfaces. At least one of the first conductive traces is connected at its outer radius to at least one other of the first conductive elements at its outer radius by a first interconnect first interconnect is bounded by inner and outer edges. The first interconnect has a starting region, a transition region, an ending region, and a first radiused inner edge section extending from the connected first conductive trace at its outer radius to the transition region, and a second radiused inner edge section connecting the transition region to the outer radius of the one other conductive trace. At least the first radiused inner edge section and the second radiused inner edge section are each characterized by a structure for reducing eddy currents in the outer conductive portions of the interconnect.

In yet another example embodiment, a stator has a planar composite structure (PCS) with at least one dielectric layer and a conductive pattern on a surface of each said dielectric layer. The at least one conductive pattern has a plurality of first conductive traces, each extending radially from an inner radius to an outer radius and disposed angularly on one of the dielectric surfaces; with at least one of the first conductive traces connected at its outer radius to at least one other of the first conductive traces at its outer radius by a first interconnect, the first interconnect bounded by inner and outer edges. The first interconnect has a starting region, a transition region, and an ending region, and first radiused inner and outer edge sections extending from the first conductive trace to its transition region, and second radiused inner and outer edge sections extending from the transition region to the one other conductive trace at its outer radius. At least the respective slope of the first radiused inner edge section and the second radiused inner edge section are each characterized by a monotonically changing value of slope as a function of the rotational angle from the one conductive trace to the other conductive trace.

In a further example embodiment, a stator has a planar composite structure (PCS) with at least one dielectric layer and a conductive pattern on a surface of each said dielectric layer. At least one conductive pattern has a plurality of first conductive traces, each extending radially from an inner radius to an outer radius and disposed angularly on one of the dielectric surfaces, at least one of the first conductive traces being connected at its outer radius to at least one other of the first conductive traces at its outer radius by a first interconnect. The first interconnect is bounded by inner and outer edges. The first interconnect has a starting region, a transition region, an ending region, and a first radiused inner edge section and a first radiused outer edge section extending from the first conductive trace to the transition region, and a second radiused inner edge section and a second radiused outer edge section extending from the transition region to the one other conductive trace at the outer radius of the other conductive trace. At least between an inner edge section and an outer edge section of the interconnect in its transition region, the interconnect has at least one slit-like elongated region that does not substantially reduce electrical conductivity from one end of the interconnect to the other end of the interconnect, the slit-like elongated region extending substantially parallel to the inner edge section in the transition region of the interconnect.

In yet another example embodiment of the disclosure, a stator has a planar composite structure (PCS) having at least one dielectric layer and a conductive pattern on a surface of each said dielectric layer. At least one conductive pattern has a plurality of first conductive traces, each extending radially from an inner radius to an outer radius and disposed angularly on one of the dielectric surfaces. At least one of the first conductive traces is connected at its outer radius to at least one other of the first conductive traces at its outer radius by a first interconnect. The first interconnect is bounded at least by inner and outer edges. The first interconnect has a starting region, a transition region, and an ending region, and a first radiused inner edge section extending from the first conductive trace to the transition region, and a second radiused inner edge section extending from the transition region to the one other conductive trace at the outer radius of the other conductive trace. The inner edge of the interconnect from the connection between the first conductive trace and the starting region to the beginning of the transition region is designated the "CT inner edge" distance. An example embodiment achieves at least 90% of the maximum current density value, as determined by FEA/FEM calculations, within the first 20% of the CT inner edge measured along the inner edge of the interconnect from the first conductive trace toward the transition region.

BRIEF DESCRIPTION OF THE DRAWINGS

In the figures, elements and steps denoted by the same reference numerals are associated with the same or similar elements and steps, unless indicated otherwise.

DETAILED DESCRIPTION

Figure 1:
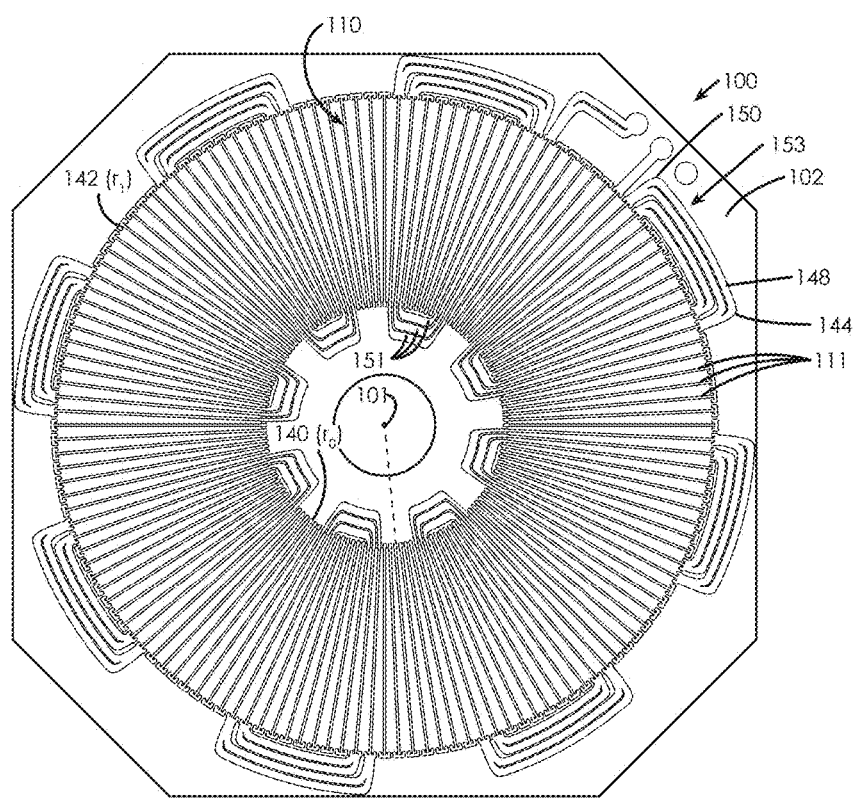
FIG. 1 illustrates a plan view of a stator including a PCS having at least one dielectric layer with one of a plurality of conductive layers being illustrated in accordance with some embodiments of the disclosure.

Referring to FIG. 1, in an example embodiment of the disclosure, a plan view of a stator 100 for use in an electrically driven motor or a rotating generator, has a planar composite structure (PCS) 110 with at least one dielectric layer and a plurality of substrate layers having conductive traces 111 thereon. The diameter of the stator shown in FIG. 1 can be on the order of cm to tens of meters. Conductive traces 111 can be part of a winding structure in accordance with an embodiment of the disclosure that can be connected at the outer annulus and inner section of a PCB structure. PCS 110 is characterized at least in part by a center origin point 101 and an outer periphery 102. Stator 100 includes a plurality of first conductive traces 111 extending radially from a radius 140 ($r_0$) (measured from the center origin point 101) to a radius 142 ($r_1$) (measured from center origin point 101) toward periphery 102 of PCS 110 and disposed angularly on the PCS. One or more of the first conductive traces are connected at their outer end, at radius $r_1$, to typically one or more other of the first conductive trace(s) at its outer radius $r_1$. Such an interconnect, designated as an outer loop, has a starting region 144, a transition region 148, and an ending region 150.

In a complementary manner, a plurality of the conductive traces are connected at their inner ends, at radius $r_0$, by inner conductive loops 151, each inner conductive loop similarly having a starting region, a transition region, and an ending region. In this manner, the combination of conductive traces 111, and their connecting structures, provide for a winding structure on the surface(s) of the dielectric layer(s).

In more complex structures, the conductive traces 111 can be connected to conductive traces on other layers using interior layer connections such as vias or other interior layer links. In these interlayer connections, the combination of the conductive traces on each of, for example, two (or more) layers combine to form an advantageous structure of multilayered windings as is well known in the field.

There is a concern, however, that the current passing from one conductive trace 111 to the next conductive trace does not create electromagnetic fields which may damage or reduce the efficiency of the operating system of the motor or generator. Such negative effects can result, for example, in parasitic currents or eddy currents in nearby electrically conductive structures which can act as a drag on the system. As is explained further below, such drag reduces efficiency, and is not typically considered in the structural design of the motor or generator of FIG. 1. However the present disclosure is directed to reducing substantially, by proper shaping and design of the interconnecting end loops 151, 153, such undesirable electromagnetic fields.

Thus, a stator 100 may include multiple layers similar to the one illustrated in the planar view of FIG. 1. The multiple layers may be arranged to provide a sequence of coils or windings that are connected, usually in series, to form the poles of a motor or generator. The poles are then typically segregated into groups, with at least one group for each phase of current supplied to the motor (or generated by the generator). Collectively, when properly controlled by an external electric circuit, the arrangement of conductors (for example, traces 111, and interconnecting conductive traces 151 and 153 in PCS 110) creates a rotating current density and associated magnetic field. This rotating current density (and magnetic field) can exert a torque on a surrounding magnetic structure (for a motor) or generate a current output (for a generator). The part of the printed circuit board with the radial structures 111 (the "active area") is the part of the stator designed to participate in this interaction. Accordingly, the active area of stator 100 may include conductive traces 111 coupled through interconnecting conductive traces 151 and 152 to form the rotating current. Some embodiments include two sets of rare-earth magnets fixed to a shaft passing through the center origin point 101 of PCS 110, which forms a compact, high-efficiency axial field synchronous electric device. In addition to the active area including a rotating current density that interacts with an inhomogeneous magnetic field, stator 100 may include conductive elements in a peripheral area and conductive elements in an interior area. Conductive elements and can dissipate heat generated by stator 100, while in operation.

In accordance with the structure of the disclosure, a planar PCB, for example, for a rotary electrical motor or generator, has inner, outer, and neutral end-turn structures which are shaped to optimize stator performance. In a planar PCB motor stator, or planar composite stator (PCS), the end turn design is of critical importance for the simple reason that end-turns serving different roles in the winding plan usually cannot co-exist on a single layer, and also cannot appear on a large number of layers as a method of reducing their total resistance. Another consideration for end-turns is that they are in close proximity to other conductive materials, for example, other structures on the same or adjacent layers, which can lead to eddy currents and parasitic loads at high frequencies.

The present disclosure addresses both issues, and can be compared to other design strategies and structures through use of finite element measurements (FEM). The use of "end-turn" in the following description should be understood to include similar features in inner and outer end turns, in links between pole groups, in cross-layer links, power connections, and in neutral tie-point structures. It is also important to recognize that while a major use of the technology disclosed herein is for no tears and generators, the application of the technology to any printed circuit board, single layer or multilayered, can be advantageous for reducing losses in the circuit. It is also important to note that within the motor/generator field, the number of end turns and their function will vary depending upon the number of phases, turns, and the poles for the motor.

As noted above, an inner or outer end turn has several connected regions. The basic functional part of an end-turn is a corner, a region that connects electrical current from an active region radial conductor or trace to a prescribed radius after the turn or corner is executed, typically changing the direction of the current on the planar surfaces from a substantially radially directed current to an angularly directed current. Often, the turn connects to a narrow width radial trace at its beginning connection point, the width of the radially directed trace being dictated by the spacing of conductors in the active region of the plane and the space available for the angular part of the turn. For purposes of illustration, and because the feature under consideration is approximately (locally) Cartesian, the angular travel in the embodiments that follow is indicated on the x-axis, while the radial travel is indicated on the y-axis. There is a conformal map between this case and the cylindrical coordinate case directly applicable to the PCS for axial field machines.

Figure 2A:
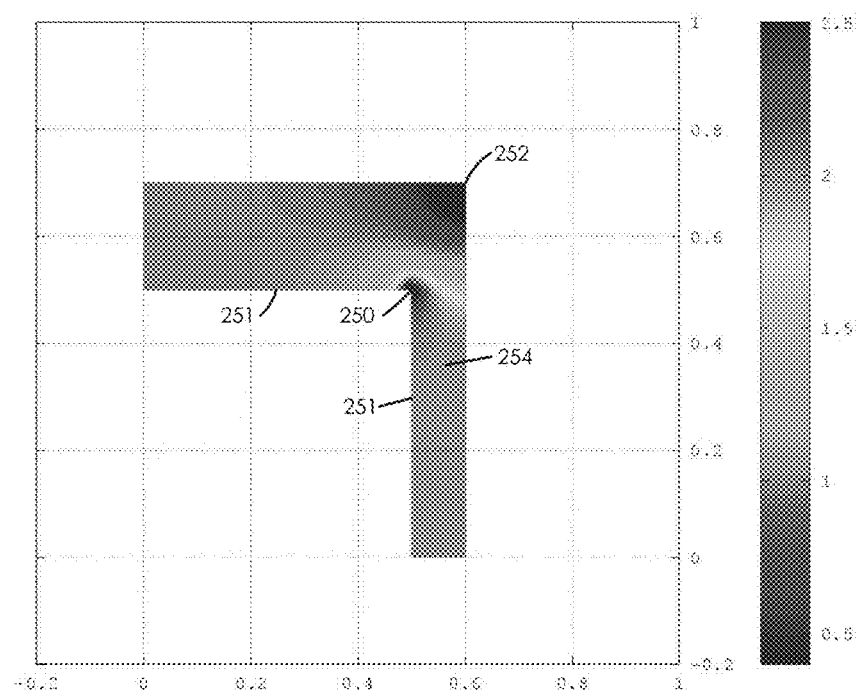
FIG. 2A is a black-and-white copy of a color illustration of an FEM solution for current density in an end-turn corner with sharp corners.
Figure 2B:
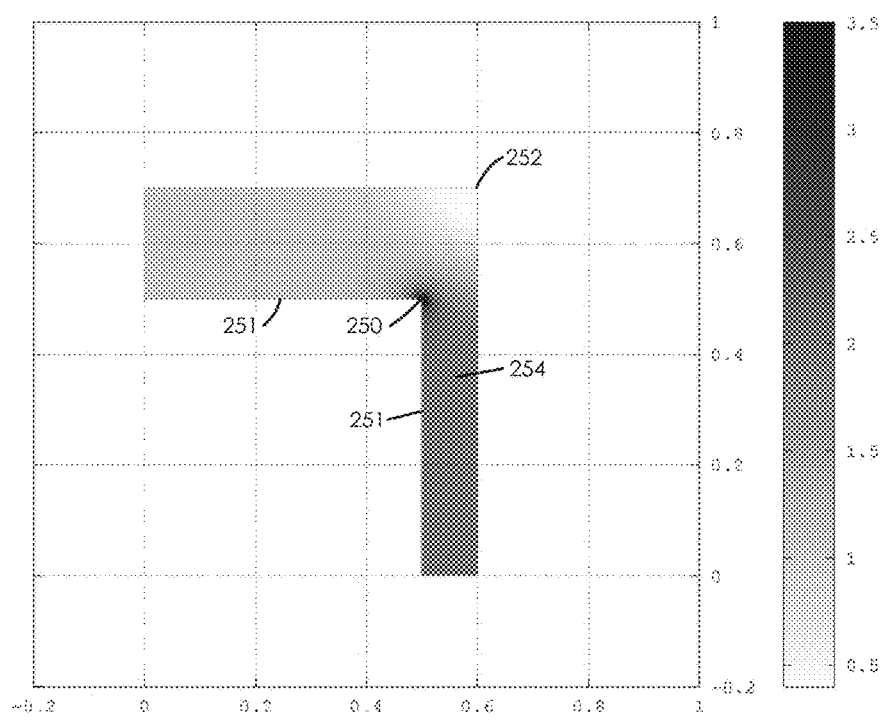
FIG. 2B is a grayscale version of the FEM solution shown in FIG. 2A.
Figure 3A:
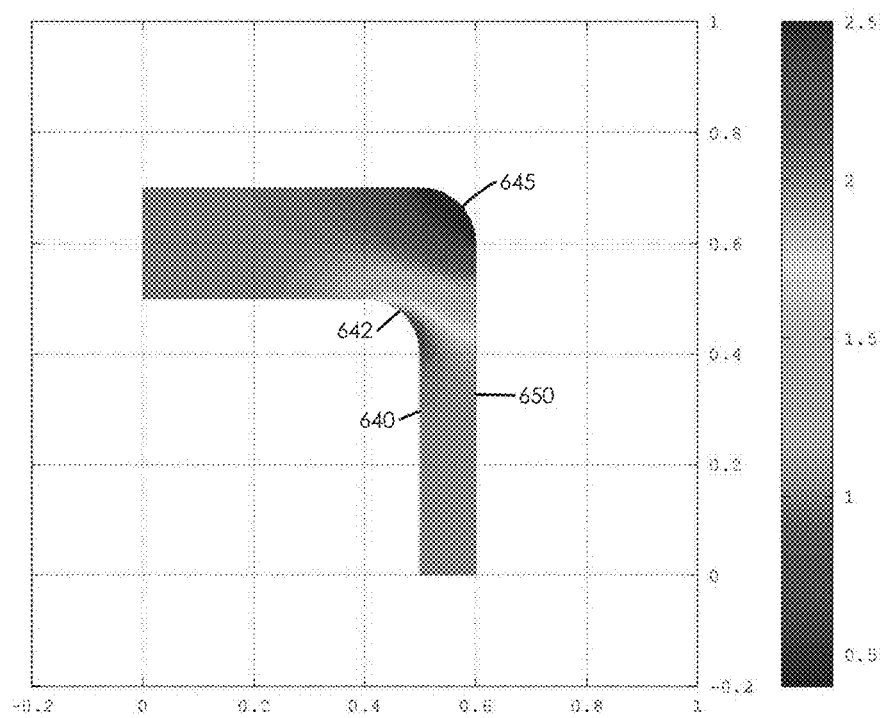
FIG. 3A is a black-and-white copy of a color illustration of an FEM solution for current density in an end-turn corner structure with radius corners wherein the radius corresponds to the half-width of the smaller trace.
Figure 3B:
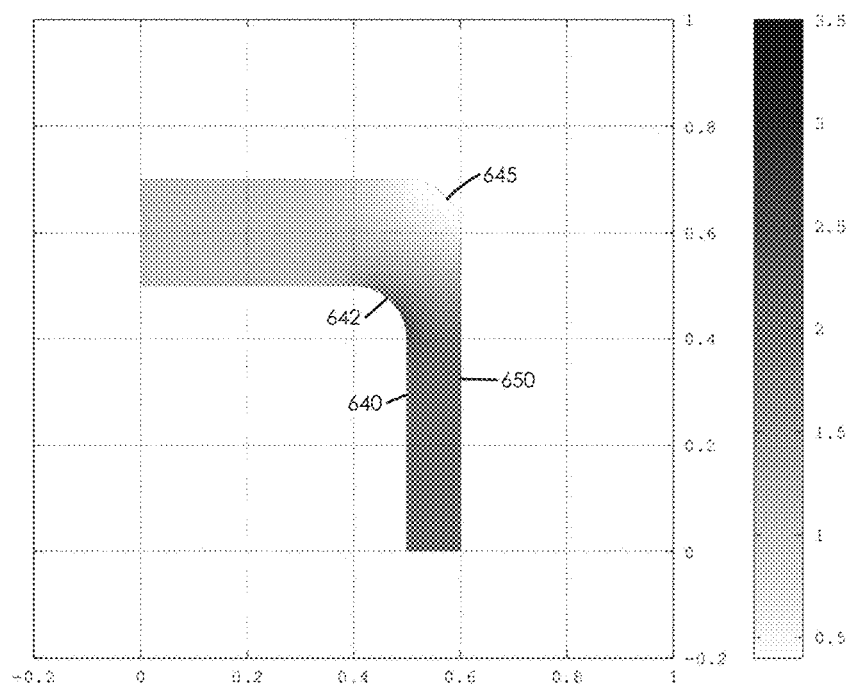
FIG. 3B is a grayscale version of the FEM solution shown in FIG. 3A.
Figure 4A:
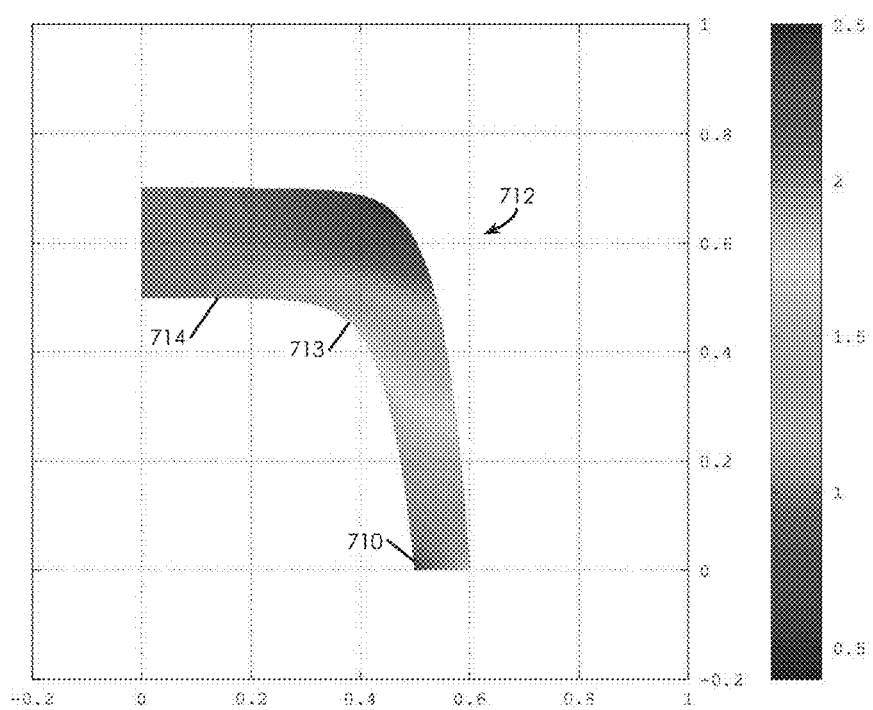
FIG. 4A is a black-and-white copy of a color illustration of an FEM solution for current density in accordance with an example embodiment of the disclosure.
Figure 4B:
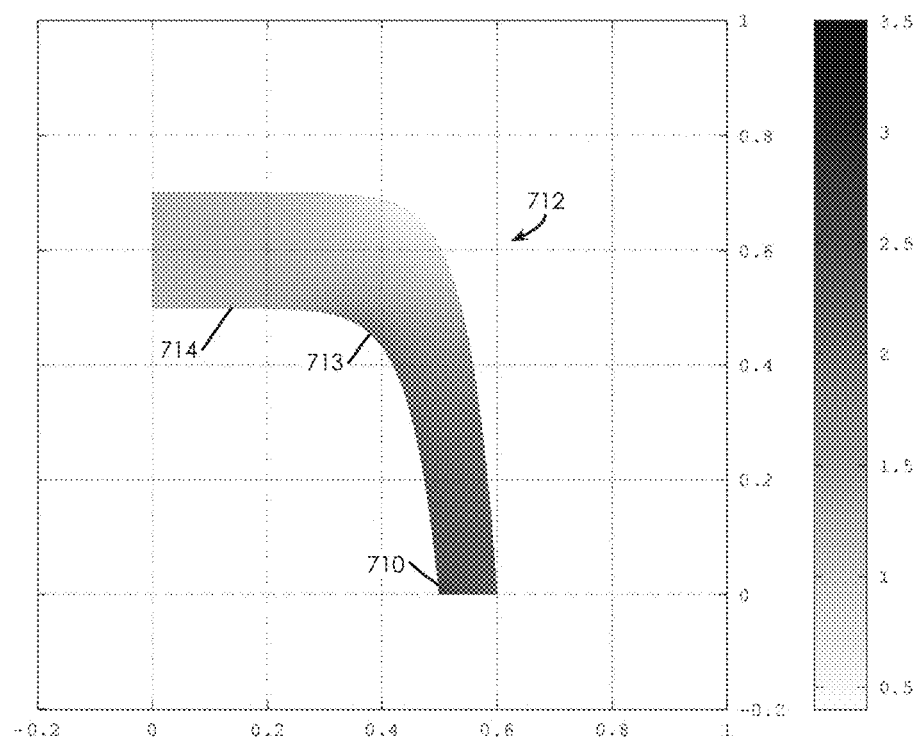
FIG. 4B is a grayscale version of the FEM solution shown in FIG. 4A.

To explore the relationship between structure or shape of the end turn design, and its performance, FEM simulations of several example designed structures and examples from earlier designs are described with the condition that each structure carry exactly the same total current. Plots of current density magnitude within a structure were subsequently produced from the FEM solution, and are illustrated in FIGS. 2-4. The scales in these plots are adjusted so that they can be compared. It should be appreciated that in the black-and-white versions of the color drawings presented herein (i.e., FIGS. 2A, 3A, 4A, 10A and 11A), the darker regions do not necessarily correspond to higher current density regions in the FEM solutions and the lighter regions do not necessarily correspond to lower current density regions in those solutions. This is true because the red and blue regions near the top and bottom, respectively, of the scales for the colored versions both copied as a darker color in the black-and-white versions. Accordingly, it is helpful to consider the grayscale versions of the FEM solutions (i.e., FIGS. 2B, 3B, 4B, 10B and 11B) in conjunction with the black-and-white copies of the colored versions of those solutions to better understand the relative current densities in the various regions.

Figure 5:
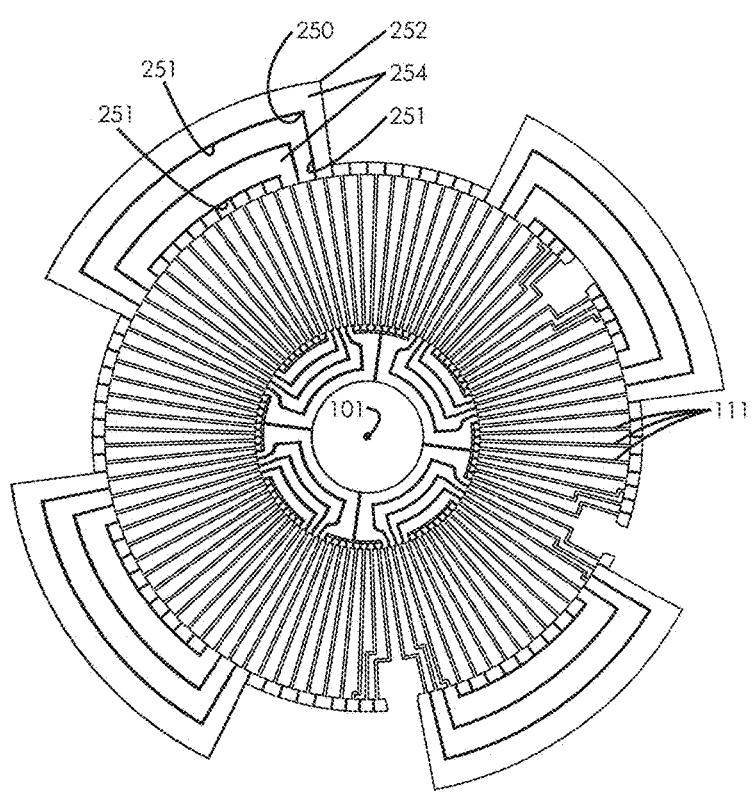
FIG. 5 illustrates a plan view of a stator including a PCS in accordance with a prior art structure having sharp corners.

It is common for prior printed circuit board CAD packages to merge lines of different widths with square corners, as illustrated in FIG. 5. End turns with corners drawn this way appear, for example, in U.S. Pat. No. 7,109,625. An adverse consequence of this structure, as shown in the FEM produced current density map in FIGS. 2A and 2B, is that the current is concentrated significantly at the inner corner 250 of the inner edge section 251 of the end turn. This creates a concentration of current, and hence energy loss at the inner edge corner, and the current is essentially zero at the outer corner edge 252. The concentration of current at the inner edge corner leads to a much stronger magnetic field H (amperes per meter, or A/m) in the immediate vicinity of the inner edge corner. The outer corner copper serves essentially no function in the conductivity of the structure, but by virtue of proximity to the high current density at the inner corner edge and other current sources on the PCS, may present an undesirable parasitic secondary to time-varying magnetic fields from such other sources. Further, the inner corner concentrates current and produces a magnetic field that may undesirably interact with other structures in the PCS. Collectively these effects lead to increased losses at higher frequencies, as well as a relatively higher resistance for the amount of copper used (because the copper at the outer edge of the corner carries substantially no current, as noted above).

The actual end-to-end conductivity of the structure in FIG. 5 varies in a predictable fashion as a function of material conductivity, thickness, and scale. For purposes of comparison and to emphasize the importance of end-turn corner shape independent of these other variables, the conductivity of the structure in FIG. 5 is designated as 1.000.

It is important to note, for the FIG. 5 shape/structure, that while the current entering the starting region 254 of the end turn is substantially uniform across the entire cross-sectional extent of the trace, in making the sharp turn it tends to congregate inward.

Figure 6:
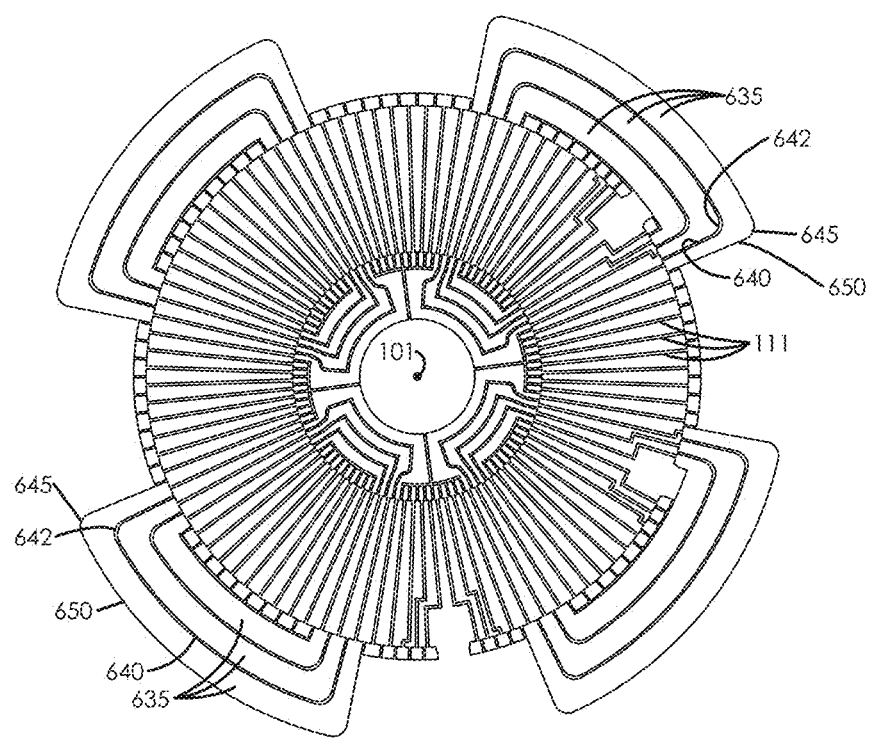
FIG. 6 illustrates a plan view of a stator including a PCS wherein the corners have a constant turning radius.

Another common practice in CAD tools is to provide the option of merging lines with the application of a specified constant turning radius at the turn. Often the radii at the inner radiused corner 642 and outer radiused corner 645 used to replace the sharp corner of FIG. 5 are chosen based on the widths of the lines to be merged. The geometry of the corner illustrated in FIG. 6 shows this type of end turn corner. Note that in FIG. 6, there are 3 nested end loops 635. In this case, the inner and outer radii for inner edge 640 and outer edge 650 are the same as the radius of the aperture used for the vertical trace segment. The operation of the structure illustrated in FIG. 6 is improved relative to the structure illustrated in FIG. 5 (as shown by the FEM simulation of FIGS. 3A and 3B), although the FIG. 6 structure/shape still shows current concentration near the inner corner edge, and some copper at the outer corner edge still does not carry significant current. The conductivity of the structure illustrated in FIG. 6 relative to FIG. 5 is 1.046. The structure of FIG. 6 therefore provides less resistance loss; however, the current density is still undesirably high at the inner corner edge resulting in the same undesirable effects noted in connection with the structure of FIG. 5, albeit at slightly lower levels.

An example embodiment described herein thus recognizes the need to obtain a further reduction from the high current densities of the earlier structures illustrated in FIGS. 2 and 5, and FIGS. 3 and 6, to determine a design shape and function which significantly reduces the concentration of current density along the inner corner, and specifically the inner corner edge, with the consequent reduction of the negative effects resulting from the high concentration of current density illustrated in FIGS. 2 and 3.

Figure 7:
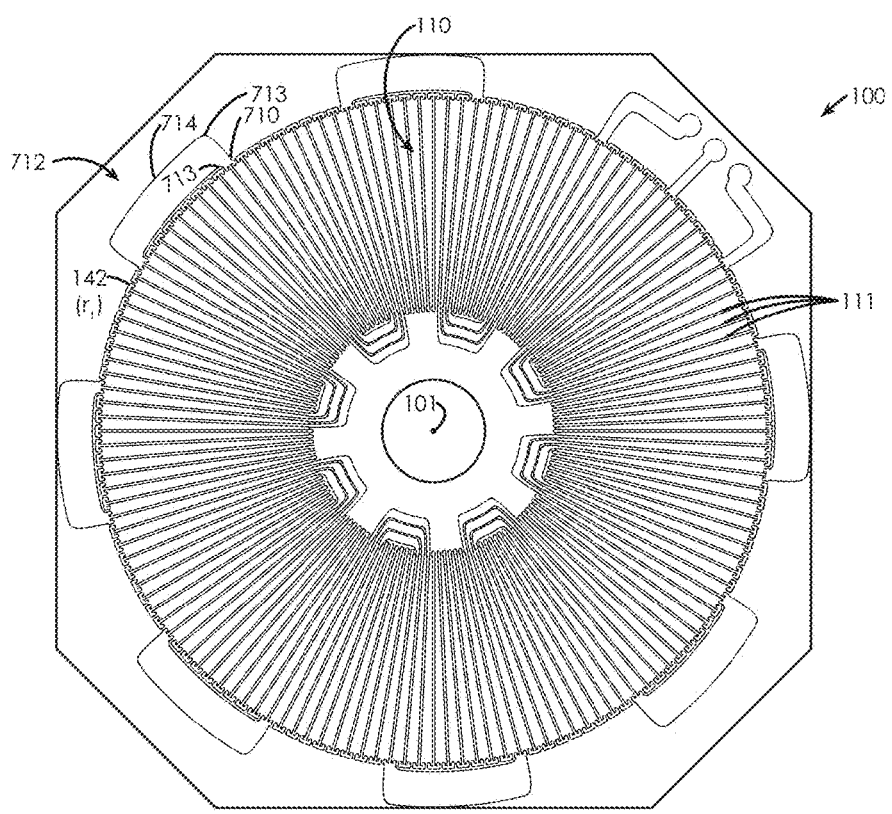
FIG. 7 illustrates details of an outer loop connection in a stator, each connection configuration including a first starting region connecting to a transition region connecting in turn to a termination region, according to some embodiments of the disclosure.

Referring to FIG. 7, the end-turn structure illustrated there is bounded by its inner and outer edges, and corresponds to a local solution of a first-order differential equation in x and y (or r and θ). This example and preferred embodiment, corresponding to a single-variable parameterization of a continuous transition from the starting width and location 710 of the end-turn corner 712, through the corner, to the x or theta directed portion 714 of the end turn. The smooth transition described in more detail below avoids the localized concentration of current in the corner transition found in the FIGS. 5 and 6 examples and does not tend to concentrate the current density in the turn.

Accordingly the undesirable magnetic fields produced by earlier structures (FIGS. 5 and 6) are minimized. The parameterization of the turn provides an independent variable that can be used for optimization purposes in different designs. As illustrated in FIG. 4, this end turn design avoids concentration of current density and magnetic field and has a relative conductivity of 1.197, almost 20% higher than the end-turn structure illustrated in FIG. 5. Further, in one particular example embodiment of the disclosure, the inner and outer edges can be shaped in accordance with the so-called "Corner equation":

$$r(\theta) = r_d + (r_s - r_d)e^{-\frac{\theta-\theta_s}{\alpha}}$$

for a corner starting at $\theta_s$ and $r_s$ and evaluated for $\theta > \theta_s$, or the equivalent reflected version with $r(\theta)=r_d+(r_s-r_d)e^{-(\theta_s-\theta)/\alpha}$ for a corner evaluated with $\theta<\theta_s$ and ending at $\theta_s$ and $r_s$. This equation provides for a gradual change of the radius of curvature along the edges and is controllable by a single parameter, $\alpha$, selected depending upon the beginning and end points of the edge. In a preferred embodiment, the slope is a continuously changing variable having a zero second derivative. This is equivalent to saying that the radiused edge is characterized by a slope, which is a linear function of r from the starting point, (the intersection between the starting region and the conductive trace) to the transition region and that the slope is a different linear function from the transitional region to the end of the ending region. The entire loop edge structure can be described from initiating trace 111 to final trace 111 by a single equation:

$$r(\theta) = r_{s1} + (r_d - r_{s1})\left(1 - e^{-\frac{\theta-\theta_1}{\alpha}}\right) + (r_{s2} - r_d)\left(e^{-\frac{\theta_2-\theta}{\alpha}}\right)$$

where $r_{s1}$, $\theta_1$ is the starting point of the structure at the initiating trace 111, $r_{s2}$, $\theta_2$ is the ending point of the structure, $\alpha$ is the parameter of the corners, and $r_d$ is the radius at which the structure extends primarily in the angular direction.

The avoidance of a concentration of current density in the loop (inner or outer) can be viewed by measuring the current density along the inner edge of a loop in the starting region. Typically, the current density measurement will be higher in the beginning of the starting region where it connects to a conductive radial trace, and lowest at the inner edge at the intersection of the starting and transition regions. If the inner edge section of the interconnect from the connection between the first conductive trace and the starting region to the beginning of the transition region is designated the "CT inner edge" distance, then in an example embodiment, the current density achieves at least 90% of the maximum current density value, as determined by FEA/FEM calculations, within the first 20% of the CT inner edge measured along the inner edge of the interconnect from the first conductive trace toward the transition region. This differs substantially from the structures of FIGS. 5 and 6 wherein the peak occurs much further away from the radial conductor at a location which more likely adversely effects parasitic and eddy currents in nearby conductors.

As noted above, the distance of a conductor to a source of electromagnetic radiation can significantly affect the strength of the electromagnetic field impinging on the conductor and its adverse consequences. This "proximity" effect is the tendency for a current in an adjacent conductor to influence the distribution of current in a primary conductor, and vice versa. This effect results in a change of current distribution in the primary conductor as well as losses in both conductors, and is apparent as an increase in the electrical resistance of the primary conductor as the current frequency increases. A closely aligned concept is: the tendency of a conductive material that is not part of the circuit at DC to become a parasitic "secondary" due to a current density induced by a time varying current in the primary conductor. This effect increases as (i) the frequency goes up, (ii) the strength of the magnetic field increases, and (iii) as the proximity of the parasitic conducting material to the primary decreases. These considerations mitigate in favor of both reducing the concentration of the electromagnetic field, for example, by using the example corner shape structure illustrated in FIG. 7, and reducing the proximity of the conductor where possible to adjacent conductors. In a preferred example embodiment of the disclosure, the "corner equation" specified hereinafter helps ameliorate both of these effects.

For either of the equations above, the parameter $\alpha$ determines the rate at which the end turn will approach its essentially constant radius, angularly directed, portion of the stator structure (the transition region). An important consideration is that the corner needs to avoid interference with nearby structures. If the nearby structures are nested corners, such as those described by the corner equation and illustrated at 153 in FIG. 1, the outer edge of an inner end turn must be less than the "constant" radius of the inner edge of the adjacent outer end turn. Further, large values of $\alpha$, may produce interference or minimum clearance violations with adjacent structures on the printed circuit board, such as termination structures that are not governed by the Corner Equation. With these considerations in mind, the determination of a suitable value of $\alpha$ can be inferred from the angular displacement (designated as $\delta$) of two adjacent radial traces 111 such as those shown in FIG. 1. In a typical stator, having for example, 120 radial traces, the angular separation $\delta$ may be, for example, on the order of 3° (or $2\pi/120$ radians) or less. Further, while a minimum fabrication clearance will factor into a precise calculation of the largest possible $\alpha$ for a given design, it is undesirable to use an a that is too large since the width of the complete end turn structure may be reduced, with the effect of increasing DC resistance of the structure. On the other hand, setting $\alpha$ to values that are too small, for example less than $0.1\delta$, effectively produces a square corner shape and reduces the advantages identified herein. Accordingly, a potential "range" for $\alpha$ where the angular separation between adjacent radial traces is, for example, between about $0.2\delta$ and $0.06\delta$ radians.

In addition to the Corner equation described above, there are other descriptions of forming and shaping the corner of an end loop or trace which also ameliorate the effects seen when the corner is "sharp." Thus, for example, as described above, and in the context of an end loop as described above in connection with, for example, and loop 714 illustrated in FIG. 7, the first radiused inner edge section and the second radiused inner edge section of the endloop in the starting and ending regions of the loop can each characterized by a slope $dr/d\theta$ which is a linear function of $r(\theta)$ from a first conductive trace to the transitional region and where the slope is a different linear function from the transitional region to the conductive trace to be connected.

In another description of the forming and shaping of the corner of in the end loop, one can select any point between the inner and outer edge of the loop, and shape the loop, so that the smallest current density magnitude under direct current excitation at that point is not less than 50% of the largest current density magnitude evaluated along the shortest line between the inner and outer edge of the loop and passing through that point. This approach accordingly also reduces the adverse effects of aggregated current density.

In yet another description for forming and shaping the corner of an end loop, the respective slope of the first radiused inner edge section and the second radiused inner edge section of the loop are each characterized by a monotonically changing value of slope as a function of the rotational angle from the one conductive trace to the conductive trace to be connected. This also reduces induced currents by reducing the aggregated current density at the corner. In yet another approach to reducing aggregated current density, an example embodiment achieves at least 90% of the maximum current density value, as determined by FEA/FEM calculations, within the first 20% of the CT (as defined above) inner edge measured along the inner edge of an interconnect from the first conductive trace toward the transition region.

Figure 8:
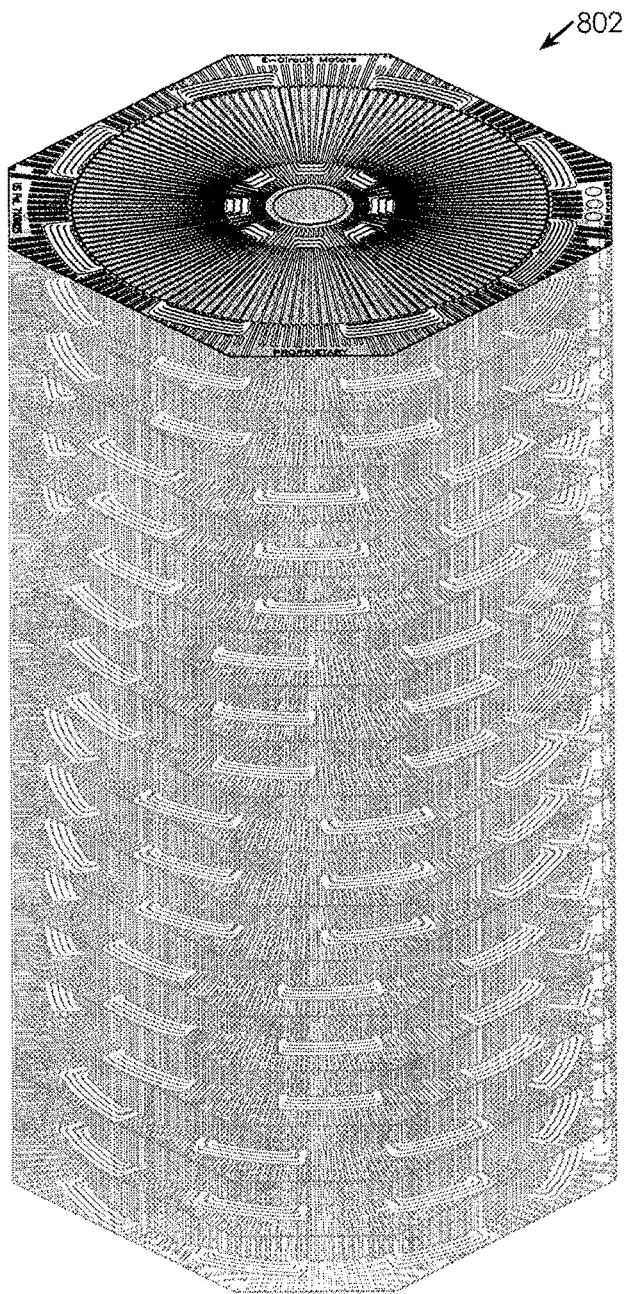
FIG. 8 illustrates a greatly expanded, in the z axis, motor stator stack up.

In practical stator designs, out-of-plane structures may also form parasitic secondary elements. FIG. 8 shows a greatly expanded (in the z-axis) rendering of a motor stator stack up. In actual construction, the spacing between copper would be roughly the same as the copper thickness. This illustrates the considerable complexity of the notion of "proximity", which can vary based on stator design parameters such as pole count, number of turns, etc. Accordingly, as shown in the Figure, conductive surfaces can be staggered in groups (groups of three as shown in FIG. 8 are but one example configuration), in structure, and in function in order to maintain the necessary efficiencies of the overall device. Thus, for example, all of the outer loops will not align for the full height of the stacked layers of the motor/generator stator, and advantages will be obtained in reduced electromagnetic fields generated at other than the active area of a board.

Figure 9:
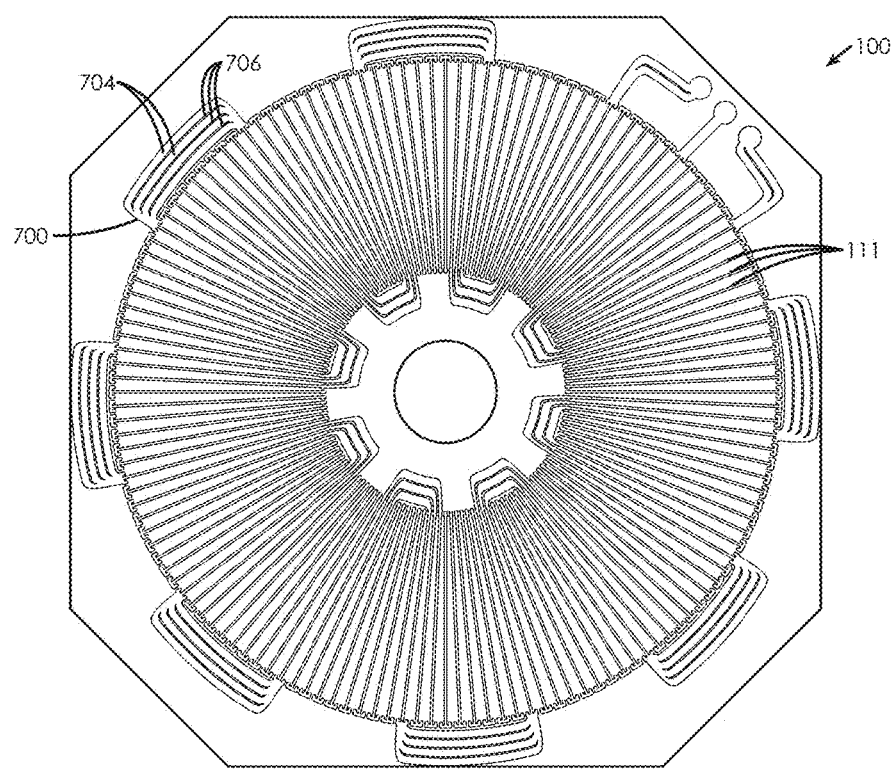
FIG. 9 illustrates an end turn loop having an interconnecting trace which is split longitudinally.
Figure 10A:
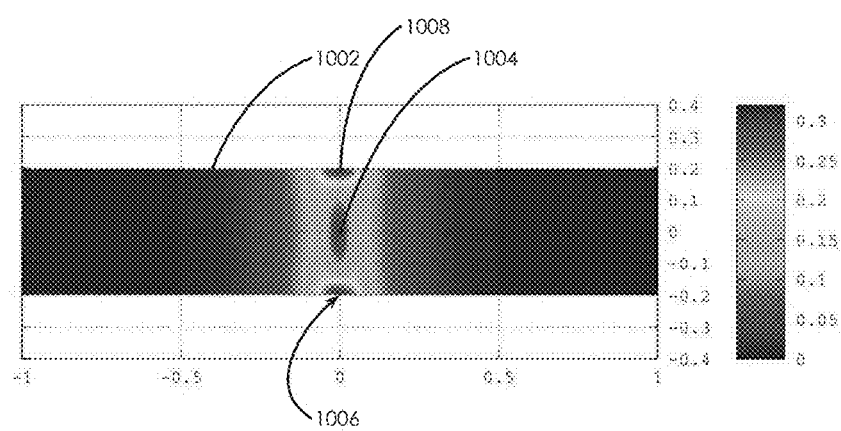
FIG. 10A is a black-and-white copy of a color illustration of an FEM solution showing a resulting current density without the narrow elongated slit-like regions illustrated in FIG. 9.
Figure 10B:
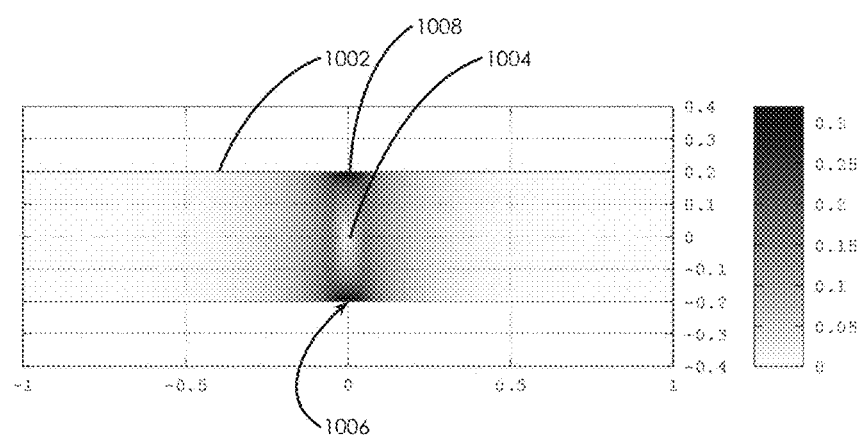
FIG. 10B is a grayscale version of the FEM solution shown in FIG. 10A.
Figure 11A:
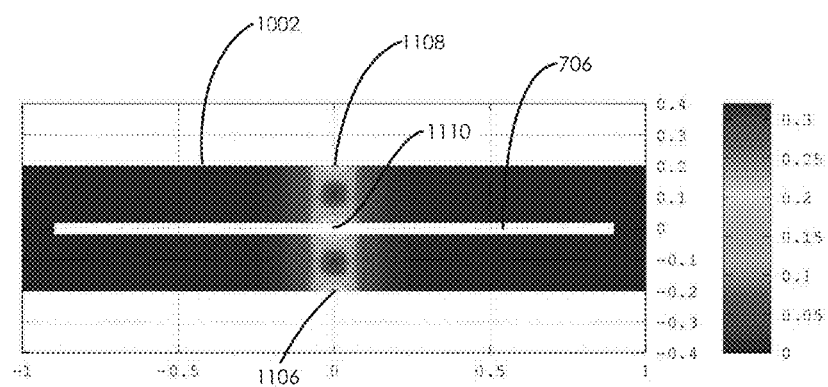
FIG. 11A is a black-and-white copy of a color illustration of an FEM solution showing a resulting current density with the narrow elongated slit-like regions illustrated in FIG. 9.
Figure 11B:
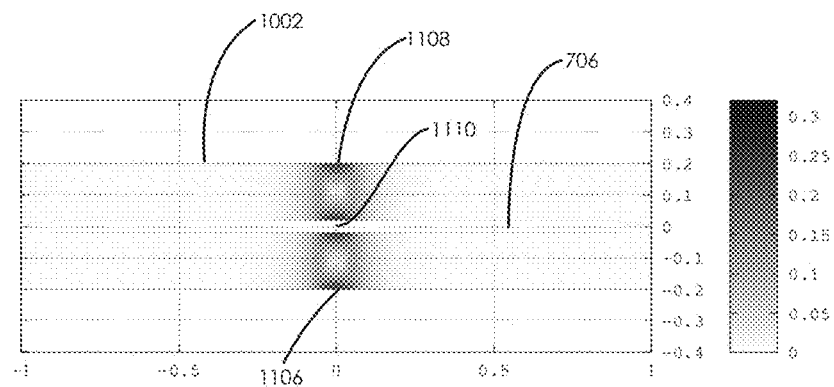
FIG. 11B is a grayscale version of the FEM solution shown in FIG. 11A.

Referring to FIG. 9, an end turn loop 700 has an interconnecting trace which is split longitudinally into two or more parallel paths 704 for most of its length. The longitudinal split(s) have little effect on end-to-end conductivity, but does change the way in which time-varying flux is linked by the structure. The resulting current density induced in the end-turn segments separated by the slit(s) 706 (caused by narrow elongated region(s) of substantially no or zero electrical conductivity) is illustrated in FIGS. 10 and 11 by a simulation, using the same conditions, so that the effects can be compared across different embodiments, both in shape and magnitude. Further, the effect of the slits is to prevent a substantial increase in current density often seen when no slit or fewer slits are used.

The FEM result displayed in FIG. 10 shows a substantial effect of induced current caused by an external time-varying field at the origin 1004 of elongated trace 1002. The induced currents are particularly large at the origin, and the surface regions 1006 and 1008 vertically aligned with the origin. Note that the longitudinal slit 706 in FIG. 11, given a particular radial clearance for the end turn, necessarily reduces the cross-sectional area and therefore increases the DC resistance of the end-turn segment. Further, the width of the slit is dependent on the copper thickness, which determines the minimum feature size achievable using the photoresist/etch process by which printed circuit boards are made. Thus, the number of slits in any given design is dependent on the flux leakage, other dB/dt sources, radial clearance for end turns, and the operating speed of the motor or generator design. Advantageously, however, as illustrated in FIG. 11, the existence of these novel slits can substantially reduce induced current distributions in end turn, link, neutral, power connection, and similar features in a stator design, at both the origin and at the aligned surface regions. The physical extent of the effect of the induced current is also reduced.

A design consideration in stator 100 involves a trade-off between conduction and eddy current losses in the stator active area. To reduce conduction losses, the conductors must be wider (or connected in parallel on subsequent layers). To reduce eddy current losses, the effective areas capturing time-varying flux must be smaller, thus the conductors must be narrower.

A third heat source involves eddy currents due to the magnetic field from current carrying conductors. This effect is important to consider in the inner and outer regions of the PCB, where different layers may perform different functions.

Figure 12:
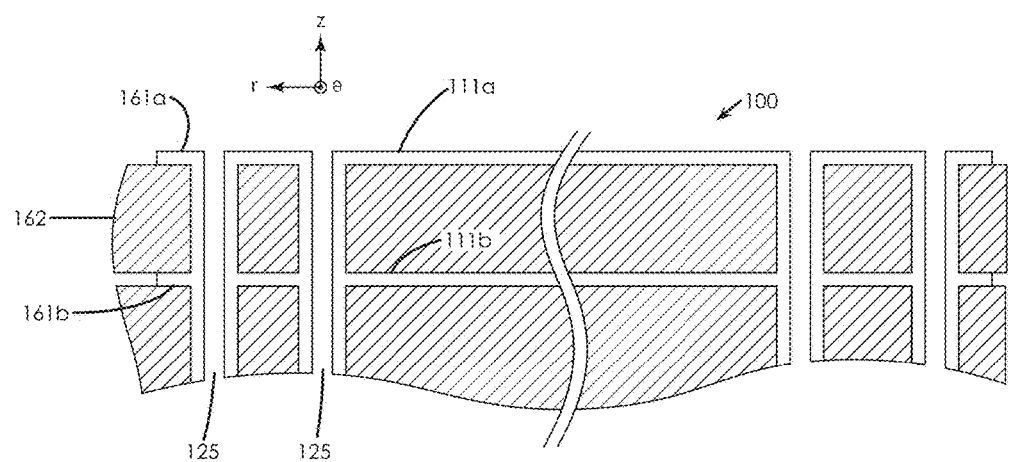
FIG. 12 illustrates a cross-sectional view of a section of stator 100 according to some embodiments.

FIG. 12 illustrates a partial cross-sectional view of stator 100, according to some embodiments. Without limitation and for illustration purposes, a "z" axis is shown in the direction of the stacking of the different layers in stator 100, and a perpendicular axis 'r' is shown along its cross section. As seen, stator 100 may include a dielectric substrate 162 sandwiched between conductive layers 161a and 161b. Vias 125 provide electrical conductivity between conductive layers 161a and 161b. In addition, a via (or vias) 125, which is electrically conducting, may also provide thermal conductivity between layers 161a and 161b due to the conducting material that is typically used in these elements (e.g., copper, aluminum, tin, tungsten, and derived compounds). Dielectric substrate 162 may include any material used in PCBs, such as a composite material including woven fiberglass with an epoxy resin binder (e.g., FR-4 and the like). As illustrated in FIG. 12, the non-crosshatched regions, that is, the clear regions, are electrically conductive and vias 125 extend through the substrate providing electrical contact from the traces on one surface to the traces on the opposite surface of the substrate.

Accordingly, in some embodiments, stator 100 includes at least one of conductive elements 111, located on different conductive layers 161a and 161b. For example, conductive element 111a may be one of the plurality of conductive elements 111 in the active area of stator 100 and disposed on conductive layer 161a. Correspondingly, conductive element 111b may be one of the plurality of conductive elements 111 in the active area of stator 100 and disposed on a different conductive layer 161b.

Figure 13:
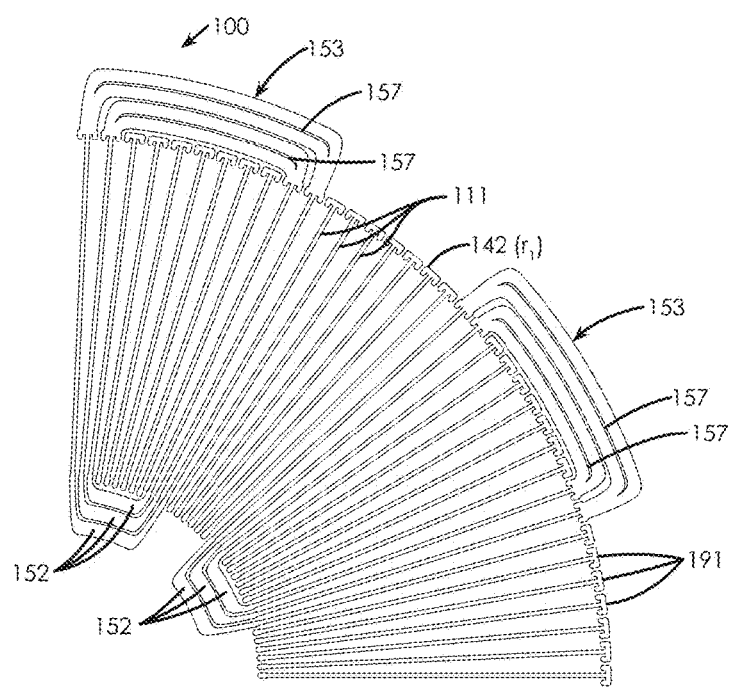
FIG. 13 illustrates a detail of stator 100 including a plurality of conductive elements 111 disposed on the PCS.

FIG. 13 illustrates a detail of stator 100 including a plurality of conductive elements 111, disposed radially on PCS 110, according to some embodiments. Conductive elements 152, the inner loops, are disposed angularly on PCS 110 and in this example embodiment, the outer loops are split along the slits 157. The inner loops illustrated here are not split due to the limited space available closer to the center of the stator. In some embodiments, stator 100 further includes a plurality of third conductive elements extending radially from a radius greater than $r_1$ from center origin point 101 toward periphery 102 and disposed angularly on PCS 110, wherein at least one of the third conductive elements and at least one of the second conductive elements are coincident but located on different conductive layers. For example, and without loss of generality, the third conductive elements may be included in conductive layer 161a, and the second conductive elements 121b may be included in conductive layer 161b.

In the illustrated embodiment of FIG. 13, the radial conductive traces 111 can terminate at a termination connector 191 at a distance 142 ($r_1$) from center origin point 101. These connectors are described in more detail in co-pending U.S. application Ser. No. 15/199,527 identified and incorporated by reference above.

Figure 14:
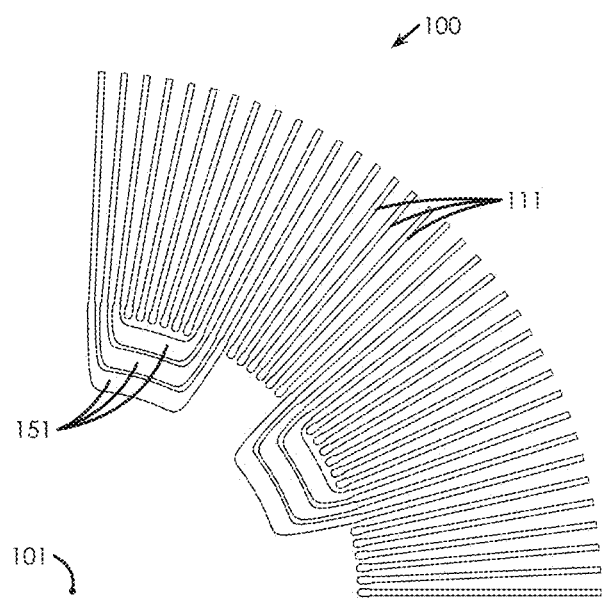
FIG. 14 illustrates a detail of an inner area of the stator proximal to the center origin point.

FIG. 14 illustrates a detail of an inner area proximal to center origin point 101 of stator 100, including a plurality of conducting elements 111 disposed radially and conductive elements 151 disposed angularly on PCS 110, according to some embodiments. Due to the spatial constraints near center origin point 101, in some embodiments only certain conductive elements 151 are electrically coupled to corresponding conductive elements 111. This arrangement avoids making undesirable electrical contact between adjacent conductive elements such as those used to enhance thermal energy dissipation, near center origin point 101. In addition, to address the issue of thermal and electrical conductivity in the highly constrained space of the inner area of PCS 110, conductive elements such as end loops 151 can alternate or be staggered, with one end loop being on one layer of a multilayered PCS 110 and the other end loop being on an adjacent layer of PCS 110. By staggering the end loops, in different conductive layers, they can extend inward while maintaining a desired clearance between adjacent conductive elements on the same conductive layer. Other staggering configurations consistent with this feature may be envisioned, for example connecting every third or fourth conductive element through a via. The vias can extend not only between conductive layers on the surface of a single substrate, but across multiple layers as well.

Some embodiments include one or more vias between layers near the outer portions of termination structure 115 to provide electrical connection between layers. These vias are typically employed in interlink connections, and in particular in connection with the outer and inner loops, to provide the winding structures required by the device. These connections can employ multiple vias, or only one via, extending through multiple layers to enable the connections necessary for the required circuit. Thus, the starting region of an inner or outer loop can be on a first layer, the ending region on a second layer, and the transition region can then include the interlink connections (for example, a trace wire connecting to the starting region, a via or other interlayer connector, and a second connecting trace connecting to the ending region). In this configuration, as in the configurations shown for example in FIG. 7, the traces of the starting region and the ending region will want to meet the terms of, for example, a Corner equation.

Figure 15:
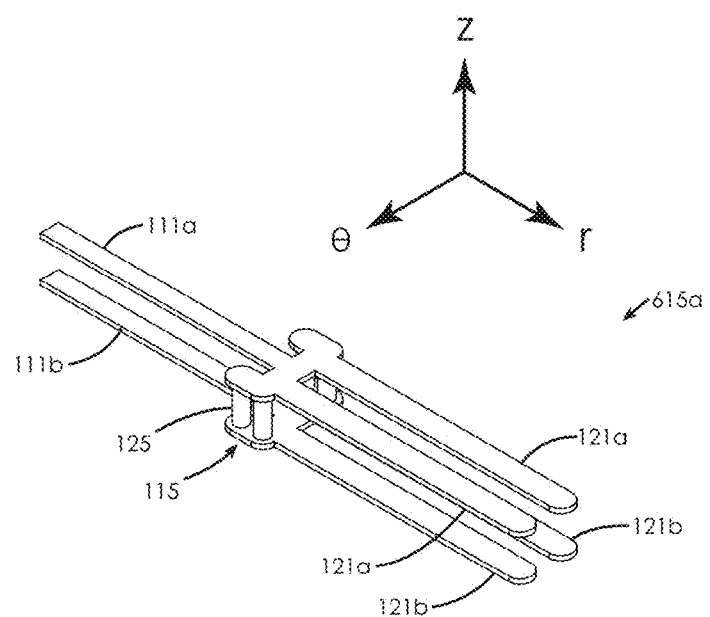
FIG. 15 illustrates a perspective view of connection configurations according to some embodiments of the disclosure.

FIG. 15 shows a perspective view of connection configuration 615a, according to some embodiments. Connection configuration 615a includes conductive elements 111a,b and 121a,b in two different conductive layers (e.g., conductive layer 161a and 161b), forming an electrical coupling at termination structure 115. More specifically, connection configuration 615a provides electrical coupling between conductive elements 111a,b and conductive elements 121a, b.

Figure 16:
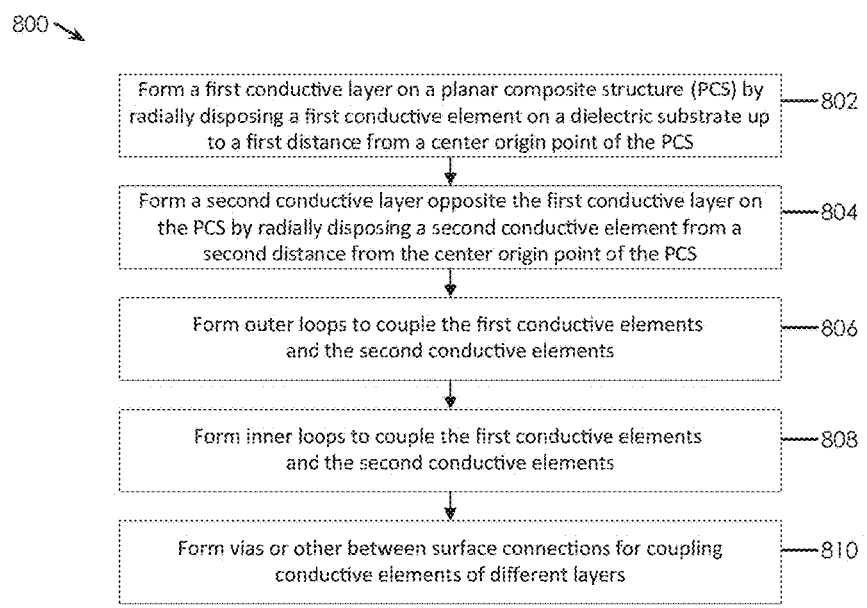
FIG. 16 is a flow chart in a method for manufacturing a stator including a planar composite layer (PCS) having at least one dielectric layer and a plurality of conductive layers, according to some embodiments.

FIG. 16 illustrates a flow chart for a method 800 for manufacturing a stator including a planar composite layer (PCS) having at least one dielectric layer and a plurality of conductive layers, according to some embodiments (for example, stator 100, PCS 110, dielectric substrate 162, conductive layers 161a, b).

Methods consistent with the present disclosure may include at least some, but not necessarily all, of the steps illustrated in method 800, and in some embodiments may be performed in a different sequence. Furthermore, methods consistent with the present disclosure may include at least two or more steps as in method 800 performed overlapping in time, or almost simultaneously.

Step 802 includes forming a first conductive layer on the one surface of the PCS by radially disposing in accordance with the disclosure herein, first conductive elements on a dielectric substrate each starting from a first distance from a center origin point of the PCS and extending radially to a fixed outer radius. Step 804 includes forming a second conductive layer on a side of the substrate opposite the first conductive layer, by disposing a second conductive elements extending radially from a prefixed distance from the center origin point of the PCS.

Step 806 includes forming a plurality of outer end loops in accordance with embodiments of the disclosure on both surfaces of the substrate, and coupling, in accordance with the disclosure herein, the first conductive elements to each other and to the second conductive elements through an interlink connection using the outer loops. Step 808 includes forming a plurality of inner end loops in accordance with embodiments of the disclosure on both surfaces of the substrate, and coupling, in accordance with the disclosure herein, the first conductive elements to each other and to the second conductive elements through an interlink connection using the inner loops. In step 810, vias or other between surface connections can be employed.

In some embodiments, coupling the first conductive element with the second conductive elements may include a thermal coupling. Furthermore, the coupling can include a connection configuration having interlink structures including vias that go through the dielectric substrate from one conductive layer to another, non-adjacent, conductive layer (for example, using vias 125).

One skilled in the art will realize the disclosure may be embodied in other specific forms without departing from the spirit or essential characteristics thereof. The foregoing embodiments are therefore to be considered in all respects illustrative rather than limiting of the disclosure described herein. The scope of the disclosure is thus indicated by the appended claims, rather than by the foregoing description, and all changes that come within the meaning and range of equivalency of the claims are therefore intended to be embraced therein.

Various aspects of the present invention may be used alone, in combination, or in a variety of arrangements not specifically discussed in the embodiments described in the foregoing and is therefore not limited in this application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc. in the claims to modify a claim element does not by itself connote any priority, precedence or order of one claim element over another or the temporal order in which acts of a method are performed, but are used merely as labels to distinguish one claimed element having a certain name from another element having a same name (but for use of the ordinal term) to distinguish the claim elements.

Also, the phraseology and terminology used herein is used for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An apparatus, comprising:
 a planar composite structure (PCS) comprising at least one dielectric layer and a conductive pattern on a surface of the at least one dielectric layer, the conductive pattern comprising:
  at least first and second conductive traces, each extending radially from an inner radius to an outer radius and disposed angularly on the surface; and
  a first interconnect having a first portion connected to the first conductive trace at the outer radius and a second portion connected to the second conductive trace at the outer radius;
 wherein the first interconnect is bounded by an inner edge and an outer edge, and has a starting region, a transition region, and an ending region, the starting region having a first radiused inner edge section extending from the first conductive trace to the transition region; and
 wherein at least a portion of the first radiused inner edge section has a curvature that varies continuously as a function of arc length.

2. The apparatus of claim 1, wherein the curvature of the first radiused inner edge section is characterized at least in part by the Corner Equation $$r(\theta)=r_d+(r_s-r_d)e^{-(\theta-\theta_s)/\alpha}$$

for a corner starting at $\theta_s$ and $r_s$ and evaluated for $\theta>\theta_s$, or the equivalent reflected version with $$r(\theta)=r_d+(r_s-r_d)e^{-(\theta_s-\theta)/\alpha}$$

for a corner evaluated with $\theta<\theta_s$ and ending at $\theta_s$ and $r_s$.

3. The apparatus of claim 2, wherein an angular separation between the first conductive trace and an adjacent conductive trace that also extends radially from the inner radius to the outer radius is $\delta$ radians, and $\alpha$ ranges between $0.06\delta$ and $0.2\delta$ radians.

4. The apparatus of claim 1, wherein:
 the ending region has a second radiused inner edge section extending from the transition region to the second conductive trace; and
 at least a portion of the second radiused inner edge section has a curvature that varies continuously as a function of arc length.

5. The apparatus of claim 4, wherein the curvature of the first radiused inner edge section and the second radiused inner edge section are each characterized at least in part by the Corner Equation $$r(\theta)=r_d+(r_s-r_d)e^{-(\theta-\theta_s)/\alpha}$$

for a corner starting at $\theta_s$ and $r_s$ and evaluated for $\theta>\theta_s$, or the equivalent reflected version with $$r(\theta)=r_d+(r_s-r_d)e^{-(\theta_s-\theta)/\alpha}$$

for a corner evaluated with $\theta<\theta_s$ and ending at $\theta_s$ and $r_s$.

6. The apparatus of claim 5, wherein the Corner Equation for an entirety of the inner edge of the first interconnect is characterized by the equation $$r(\theta) = r_{s1} + (r_d - r_{s1})\left(1 - e^{-\frac{\theta-\theta_1}{\alpha}}\right) + (r_{s2} - r_d)\left(e^{-\frac{\theta_2-\theta}{\alpha}}\right)$$

where $r_{s1}$, $\theta_1$ is the starting point of the structure at the initiating trace, $r_{s2}$, $\theta_2$ is the ending point of the structure, $\alpha$ is the parameter of the corners, and $r_d$ is the radius at which the structure extends primarily in the angular direction.

7. The apparatus of claim 1, wherein:
 the starting region has a first radiused outer edge section extending from the first conductive trace to the transition region, and a second radiused outer edge section extending from the transition region to the second conductive trace;
 at least a portion of the first radiused outer edge section has a curvature that varies continuously as a function of arc length; and
 at least a portion of the second radiused outer edge section has a curvature that varies continuously as a function of arc length.

8. The apparatus of claim 7, wherein the curvature of the first radiused outer edge section and the curvature of the second radiused outer edge section are each characterized at least in part by the Corner Equation $$r(\theta)=r_d+(r_s-r_d)e^{-(\theta-\theta_s)/\alpha}$$

for a corner starting at $\theta_s$ and $r_s$ and evaluated for $\theta>\theta_s$, or the equivalent reflected version with $$r(\theta)=r_d+(r_s-r_d)e^{-(\theta_s-\theta)/\alpha}$$

for a corner evaluated with $\theta<\theta_s$ and ending at $\theta_s$ and $r_s$.

9. The apparatus of claim 1, wherein the PCS has multiple layers, and further including:
 connecting structures for interconnecting portions of conductive patterns on different layers.

10. The apparatus of claim 1, wherein the apparatus comprises a stator for an axial flux motor or generator.

11. An apparatus, comprising:
 a planar composite structure (PCS) comprising at least one dielectric layer and a conductive pattern on a surface of the at least one dielectric layer, the conductive pattern comprising:
  at least first and second conductive traces, each extending radially from an inner radius to an outer radius and disposed angularly on the surface; and
  a first interconnect having a first portion connected to the first conductive trace at the outer radius and a second portion connected to the second conductive trace at the outer radius;
 wherein the first interconnect is bounded by an inner edge and an outer edge, and has a starting region, a transition region, and an ending region, the starting region having a first radiused inner edge section extending from the first conductive trace at the outer radius to the transition region, and a second radiused inner edge section extending from the transition region to the second conductive trace at the outer radius; and
 wherein at least the first radiused inner edge section and the second radiused inner edge section are each characterized by a slope $dr/d\theta$ which is a linear function of $r(\theta)$ from the first conductive trace to the transition region and where the slope $dr/d\theta$ is a different linear function from the transition region to the second conductive trace.

12. The apparatus of claim 11, wherein the PCS has multiple layers, and further including:

connecting structures for interconnecting portions of conductive patterns on different layers.

13. The apparatus of claim 11, wherein the apparatus comprises a stator for an axial flux motor or generator.

14. An apparatus, comprising:
a planar composite structure (PCS) comprising at least one dielectric layer and a conductive pattern on a surface of the at least one dielectric layer, the conductive pattern comprising:
at least first and second conductive traces, each extending radially from an inner radius to an outer radius and disposed angularly on the surface; and
a first interconnect having a first portion connected to the first conductive trace at the outer radius and a second portion connected to the second conductive trace at the outer radius;
wherein the first interconnect is bounded by an inner edge and an outer edge, and has a starting region, a transition region, and an ending region, the starting region extending from the first conductive trace at the outer radius to the transition region, and the ending region extending from the transition region to the second conductive trace at the outer radius; and
wherein at any point between the inner and outer edge, a smallest current density magnitude under direct current excitation is not less than 50% of a largest current density magnitude evaluated along a shortest line between the inner and outer edge passing through that point.

15. The apparatus of claim 14, wherein the PCS has multiple layers, and further including:
connecting structures for interconnecting portions of conductive patterns on different layers.

16. The apparatus of claim 14, wherein the apparatus comprises a stator for an axial flux motor or generator.

17. An apparatus, comprising:
a planar composite structure (PCS) comprising at least one dielectric layer and a conductive pattern on a surface of the at least one dielectric layer, the conductive pattern comprising:
at least first and second conductive traces, each extending radially from an inner radius to an outer radius and disposed angularly on the surface; and
a first interconnect having a first portion connected to the first conductive trace at the outer radius and a second portion connected to the second conductive trace at the outer radius;
wherein the first interconnect is bounded by an inner edge and an outer edge, and has a starting region, a transition region, and an ending region, the starting region having first radiused inner and outer edge sections extending from the first conductive trace at the outer radius to the transition region, and second radiused inner and outer edge sections extending from the transition region to the second conductive trace at the outer radius; and
wherein at least a respective slope of the first radiused inner edge section and outer edge section and the second radiused inner edge section and outer edge section are each characterized by a monotonically changing value of slope as a function of a rotational angle from the first conductive trace to the second conductive trace.

18. The apparatus of claim 17, wherein the PCS has multiple layers, and further including:
connecting structures for interconnecting portions of conductive patterns on different layers.

19. The apparatus of claim 17, wherein the apparatus comprises a stator for an axial flux motor or generator.

* * * * *